United States Patent
Yoon et al.

(10) Patent No.: US 11,258,032 B2
(45) Date of Patent: Feb. 22, 2022

(54) ORGANIC LIGHT EMITTING DEVICE AND DISPLAY DEVICE INCLUDING SAME

(71) Applicant: SAMSUNG DISPLAY CO., LTD., Yongin-si (KR)

(72) Inventors: Jihwan Yoon, Yongin-si (KR); Sangwoo Pyo, Yongin-si (KR); Ilsoo Oh, Yongin-si (KR); Chang-Min Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 351 days.

(21) Appl. No.: 15/632,759

(22) Filed: Jun. 26, 2017

(65) Prior Publication Data
US 2018/0006260 A1    Jan. 4, 2018

(30) Foreign Application Priority Data

Jun. 30, 2016 (KR) .................. 10-2016-0082747

(51) Int. Cl.
*H01L 51/52* (2006.01)
*H01L 51/50* (2006.01)
*H01L 27/32* (2006.01)

(52) U.S. Cl.
CPC ...... *H01L 51/5203* (2013.01); *H01L 51/5044* (2013.01); *H01L 51/5056* (2013.01);
(Continued)

(58) Field of Classification Search
CPC ............ H01L 27/3209; H01L 51/5203; H01L 51/5044; H01L 51/5056; H01L 51/5256;
(Continued)

(56) References Cited

U.S. PATENT DOCUMENTS

| 7,375,462 | B2 | 5/2008 | Suh et al. |
| 7,550,919 | B2 | 6/2009 | Kinoshita |

(Continued)

FOREIGN PATENT DOCUMENTS

| CN | 1578561 A | 2/2005 |
| CN | 101006594 A | 7/2007 |

(Continued)

OTHER PUBLICATIONS

Chen et al., "Hybrid white OLEDs with fluorophors and phosphors" Materials Today, vol. 17, No. 4, 2014, pp. 175-183. (Year: 2014).*

(Continued)

*Primary Examiner* — Dylan C Kershner
(74) *Attorney, Agent, or Firm* — Lewis Roca Rothgerber Christie LLP

(57) ABSTRACT

An organic light emitting device and a display device, the organic light emitting device including a first electrode; a first organic layer on the first electrode; a first charge generating layer on the first organic layer; a second organic layer on the first charge generating layer, the second organic layer including a first light absorbing dye having an absorption wavelength of about 380 nm to 410 nm; and a second electrode on the second organic layer, wherein light is emitted from the device in the direction from the first electrode to the second electrode.

12 Claims, 11 Drawing Sheets

(52) U.S. Cl.
CPC ...... *H01L 51/5256* (2013.01); *H01L 51/5278* (2013.01); *H01L 27/3209* (2013.01); *H01L 51/5218* (2013.01); *H01L 51/5284* (2013.01)

(58) Field of Classification Search
CPC ............. H01L 51/5278; H01L 51/5218; H01L 51/5284; H01L 51/5036; H01L 51/504; H01L 51/0061; C09K 11/06
USPC .................... 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS

| | | | | |
|---|---|---|---|---|
| 2002/0121860 | A1* | 9/2002 | Seo | H01L 51/5012 313/506 |
| 2003/0170491 | A1* | 9/2003 | Liao | H01L 51/5036 428/690 |
| 2005/0221124 | A1* | 10/2005 | Hwang | C07F 9/5728 428/690 |
| 2006/0040131 | A1* | 2/2006 | Klubek | H05B 33/14 428/690 |
| 2006/0040132 | A1* | 2/2006 | Liao | H01L 51/5036 428/690 |
| 2015/0380470 | A1 | 12/2015 | Lee et al. | |

FOREIGN PATENT DOCUMENTS

| | | |
|---|---|---|
| CN | 100589249 C | 2/2010 |
| KR | 10-2004-0084805 A | 10/2004 |
| KR | 10-2014-0092361 A | 7/2014 |
| KR | 10-2015-0076031 A | 7/2015 |

OTHER PUBLICATIONS

Chen et al., "Spiro-annulated hole-transport material outperforms NPB with higher mobility and stability in organic light-emitting diodes", Dyes and Pigments, vol. 107 (2014) pp. 15-20. (Year: 2014).*

* cited by examiner

ORGANIC LIGHT EMITTING DEVICE AND DISPLAY DEVICE INCLUDING SAME

CROSS-REFERENCE TO RELATED APPLICATIONS

Korean Patent Application No. 10-2016-0082747, filed on Jun. 30, 2016, in the Korean Intellectual Property Office, and entitled: "Organic Light Emitting Device and Display Device Including Same," is incorporated by reference herein in its entirety.

BACKGROUND

1. Field

Embodiments relate to an organic light emitting device and a display device including the same.

2. Description of the Related Art

Organic light emitting devices are self-emitting devices having fast response times and driven by low voltages. Accordingly, organic light emitting display devices including such organic light emitting devices may exclude a separate light source, and thus may be thin and lightweight. Such organic light emitting display devices have numerous advantages, such as excellent brightness and viewing angle independence.

Organic light emitting devices are display elements that include a light emitting layer made of organic material between an anode electrode and a cathode electrode. After a hole provided from the anode electrode and an electron provided from the cathode electrode combine in the light emitting layer to form an exciton, light corresponding to the energy between the hole and the electron is generated from the exciton.

Tandem organic light emitting devices may have structures that include two or more stacks of hole injection layer/hole transport layer/light emitting layer/electron transport layer/electron injection layer between the anode electrode and the cathode electrode. A charge generation layer assisting generation and movement of charges may be present between each of the stacks.

SUMMARY

Embodiments are directed to an organic light emitting device and a display device including the same.

The embodiments may be realized by providing an organic light emitting device including a first electrode; a first organic layer on the first electrode; a first charge generating layer on the first organic layer; a second organic layer on the first charge generating layer, the second organic layer including a first light absorbing dye having an absorption wavelength of about 380 nm to 410 nm; and a second electrode on the second organic layer, wherein light is emitted from the device in the direction from the first electrode to the second electrode.

The first organic layer may include a first light emitting layer to emit a first light, a first hole transport region between the first electrode and the first light emitting layer, and a first electron transport region between the first light emitting layer and the first charge generating layer; and the second organic layer may include a second light emitting layer to emit a second light that is different from the first light, a second hole transport region between the first charge generating layer and the second light emitting layer, and a second electron transport region between the second light emitting layer and the second electrode.

The second hole transport region may include the first light absorbing dye.

The first organic layer may include a phosphorescent light emitting material; and the second organic layer may include a fluorescent light emitting material.

The second organic layer may have a transmittance of 10% or less with respect to light in the wavelength range of about 380 nm to 410 nm.

A molecular structure of the first light absorbing dye may include at least one of a carbazole group, an amine group, or a fluorene group.

The first light absorbing dye may be represented by Formula 1 below:

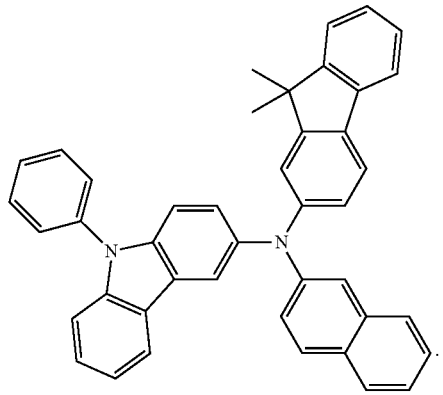

[Formula 1]

The first charge generating layer may include a first sub charge generating layer and a second sub charge generating layer.

The organic light emitting device may further include a third organic layer between the first electrode and the first organic layer; and a second charge generating layer between the first organic layer and the third organic layer.

The first organic layer may include a phosphorescent light emitting material; the second organic layer may include a first fluorescent light emitting material; and the third organic layer may include a second fluorescent light emitting material.

The organic light emitting device may further include a fourth organic layer between the second electrode and the second organic layer; and a third charge generating layer between the second organic layer and the fourth organic layer.

The first organic layer may include a phosphorescent light emitting material; the second organic layer may include a first fluorescent light emitting material; and the fourth organic layer may include a second fluorescent light emitting material.

The fourth organic layer may include a second light absorbing dye having an absorption wavelength of about 380 nm to 410 nm.

The embodiments may be realized by providing a display device including a display panel; and an organic light emitting device on the display panel, wherein the organic light emitting device includes a first electrode, a first organic layer on the first electrode, a first charge generating layer disposed on the first organic layer, a second organic layer which is disposed on the first charge generating layer and includes a first light absorbing dye having an absorption wavelength of about 380 nm to 410 nm, and a second electrode disposed on the second organic layer, light being emitted in the direction from the first electrode to the second electrode.

The first organic layer may include a first light emitting layer to emit a first light, a first hole transport region between the first electrode and the first light emitting layer, and a first electron transport region between the first light emitting layer and the first charge generating layer; and the second organic layer may include a second light emitting layer to emit a second light that is different from the first light, a second hole transport region between the first charge generating layer and the second light emitting layer, and a second electron transport region between the second light emitting layer and the second electrode.

The first organic layer may include a phosphorescent light emitting material; and the second organic layer may include a fluorescent light emitting material.

The second organic layer may have a transmittance of 10% or less with respect to light in the wavelength range of about 380 nm to 410 nm.

A molecular structure of the first light absorbing dye may include at least one of a carbazole group, an amine group, or a fluorene group.

The first light absorbing dye may be represented by Formula 1 below:

[Formula 1]

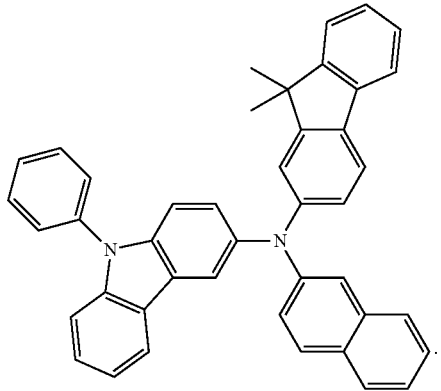

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
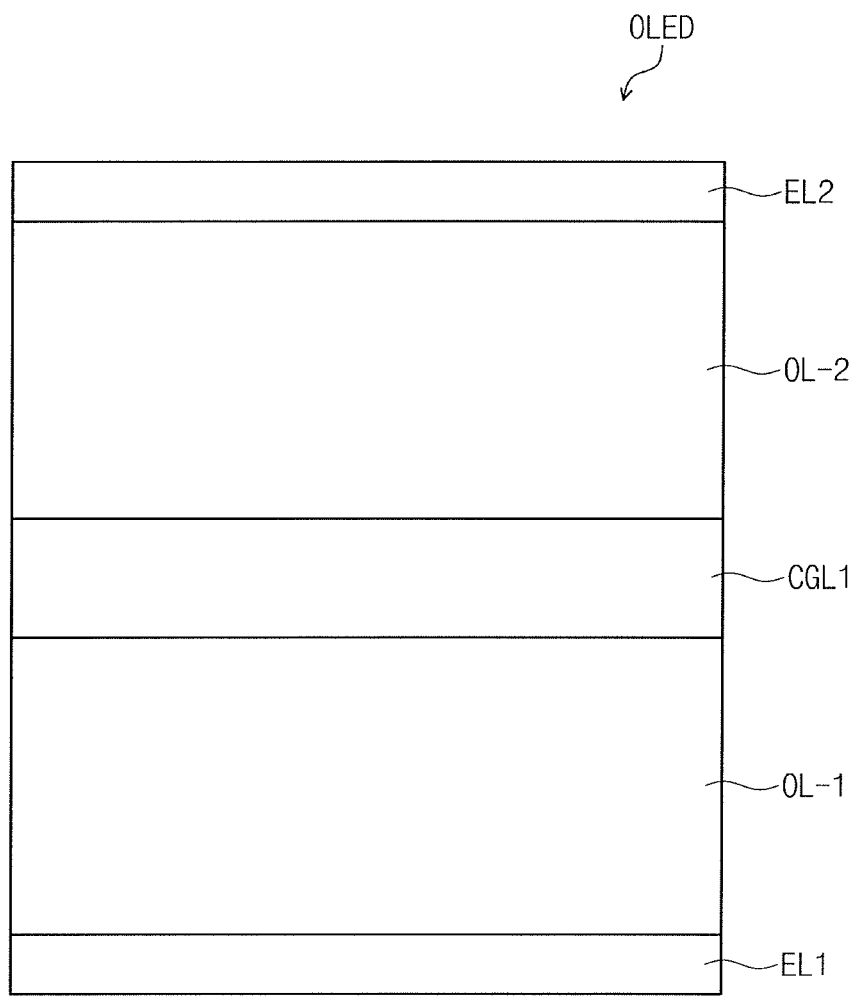
FIG. 1 illustrates a schematic cross-sectional view of an organic light emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Herein, the term "or" is not an exclusive term.

In describing each of the drawings, like reference numerals refer to like elements. It will be understood that, although the terms first, second, etc. may be used herein to describe various elements, the elements should not be limited by these terms. These terms are only used to distinguish one element from another element. For example, a first element could be termed a second element, and similarly, a second element could also be termed a first element without departing from the teachings of the present application. As used herein, the singular forms, "a", "an" and "the" are intended to include the plural forms as well, unless the context clearly indicates otherwise.

It will be understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Further, it will be understood that when an element such as a layer, a film, an area, or a plate is referred to as being "below" another element, it can be "directly below" the other element, or intervening elements may also be present.

Hereinafter, description is given of an organic light emitting device according to an embodiment.

FIG. 1 illustrates a schematic cross-sectional view of an organic light emitting device according to an embodiment.

Referring to FIG. 1, an organic light emitting device OLED according to an embodiment may include, successively laminated, a first electrode EL1, a first organic layer OL-1, a first charge generating layer CGL1, a second organic layer OL-2, and a second electrode EL2. In an implementation, the organic light emitting device OLED may be disposed on a base substrate.

In the organic light emitting device according to an embodiment, the first electrode EL1 may correspond to a reflective-type electrode. The first electrode EL1 may be, e.g., a positive electrode (anode). When the first electrode EL1 is a positive electrode, the first electrode EL1 may be a metal, e.g., silver (Ag), magnesium (Mg), aluminum (Al), platinum (Pt), palladium (Pd), gold (Au), nickel (Ni), neodymium (Nd), iridium (Ir), or chromium (Cr), having a high work function, or include a mixture of such metals. In an implementation, the first electrode EL1 may be a single metal layer including a metal, such as silver (Ag), magnesium (Mg), aluminum (Al), platinum (Pt), palladium (Pd), gold (Au), nickel (Ni), neodymium (Nd), iridium (Ir), or chromium (Cr), or a mixture of such metals; or have a multilayer structure of a metal layer including a metal, such as silver (Ag), magnesium (Mg), aluminum (Al), platinum (Pt), palladium (Pd), gold (Au), nickel (Ni), neodymium (Nd), iridium (Ir), or chromium (Cr), or a mixture of such metals, and a transparent conductive oxide layer including a transparent conductive oxide. The transparent conductive oxide may include, e.g., indium tin oxide (ITO), indium zinc oxide (IZO), zinc oxide (ZnO), indium tin zinc oxide (ITZO), or the like.

In an implementation, the first electrode EL1 may be a negative electrode (cathode). When the first electrode is a negative electrode, the first electrode EL1 may include, e.g., lithium (Li), calcium (Ca), lithium fluoride/calcium (LiF/Ca), lithium fluoride/aluminum (LiF/Al), aluminum (Al), magnesium (Mg), barium fluoride (BaF), barium (Ba), or silver (Ag), which have a low work function, or a compound or mixture thereof. The first electrode EL1 may be formed thick enough to reflect light.

In the organic light emitting device OLED according to an embodiment, the second electrode EL2 may correspond to a transmissive or semi-transmissive-type electrode. The second electrode EL2 may be, e.g., a negative electrode (cathode). When the second electrode EL2 is a negative electrode, the second electrode EL2 may include, e.g., lithium (Li), calcium (Ca), lithium fluoride/calcium (LiF/Ca), lithium fluoride/aluminum (LiF/Al), aluminum (Al), magnesium (Mg), barium fluoride (BaF), barium (Ba), or silver (Ag), which have a low work function, or a compound or mixture thereof. The second electrode EL2 may be formed thin enough to transmit light.

In an implementation, the second electrode EL2 may be a positive electrode (anode). The second electrode EL2 may include a transparent conductive oxide having a high work function. For example, the second electrode EL2 may include indium tin oxide (ITO), indium zinc oxide (IZO), zinc oxide (ZnO), indium tin zinc oxide (ITZO), or the like.

The organic light emitting device OLED according to an embodiment may be a front emission type. In this case, the first electrode EL1 may be a positive electrode (anode) and the second electrode EL2 may be a negative electrode (cathode). The organic light emitting device OLED according to another embodiment may be a rear emission type. In this case, the first electrode EL1 may be a negative electrode (cathode) and the second electrode EL2 may be a positive electrode (anode). In the organic light emitting device OLED according to an embodiment, the first electrode EL1 may be a reflective-type electrode and the second electrode EL2 may be a transmissive-type or semi-transmissive-type electrode, and the organic light emitting device OLED may emit light in the direction from the first electrode EL1 to the second electrode EL2 (e.g., may emit light out of the device through the second electrode EL2).

The organic light emitting device OLED according to an embodiment may include a plurality of organic layers OL between the first electrode EL1 and the second electrode EL2. The plurality of organic layers OL may emit light of a different wavelength range from each other. In an implementation, in the organic light emitting device OLED according to an embodiment, a first organic layer OL-1 may emit yellow light and a second organic layer OL-2 may emit blue light. When the lights emitted by the respective organic layers OL can be mixed to generate white light, the number and order of stacking of the organic layers OL, and the wavelength of the emitted light may be varied as desired. In an implementation, as illustrated in FIG. 1, the first organic layer OL-1 and the second organic layer OL-2 are shown. In an implementation, three of the organic layers OL may be disposed between the first electrode EL1 and the second electrode EL2. Embodiments in which three of the organic layers OL are disposed between the first electrode EL1 and the second electrode EL2 are described below with reference to FIGS. 3 and 4.

The first charge generating layer CGL1 may be disposed between the first organic layer OL-1 and the second organic layer OL-2 according to an embodiment. When voltage is applied to the first charge generating layer CGL1, complexes may form through oxidation-reduction reactions, thereby generating charges (electrons and holes). The first charge generating layer CGL1 may be provide the generated charges to each of the organic layers OL-1 and OL-2. The first charge generating layer CGL1 may increase, e.g., two-fold, the efficiency of the current generated in the organic layer OL, and may perform the role of adjusting the balance of the charges between first organic layer OL-1 and the second organic layer OL-2.

Hereinafter, description pertains to cases in which the organic light emitting device OLED is a front emission type. In such cases, the first electrode EL1 may be a positive electrode (anode) and the second electrode (EL2) may be a negative electrode (cathode). In an implementation, the organic light emitting device OLED may be a rear emission type. In this case, the order of stacking of the electrodes EL, organic layers OL, and the charge generating layers CGL may be different.

Figure 2:
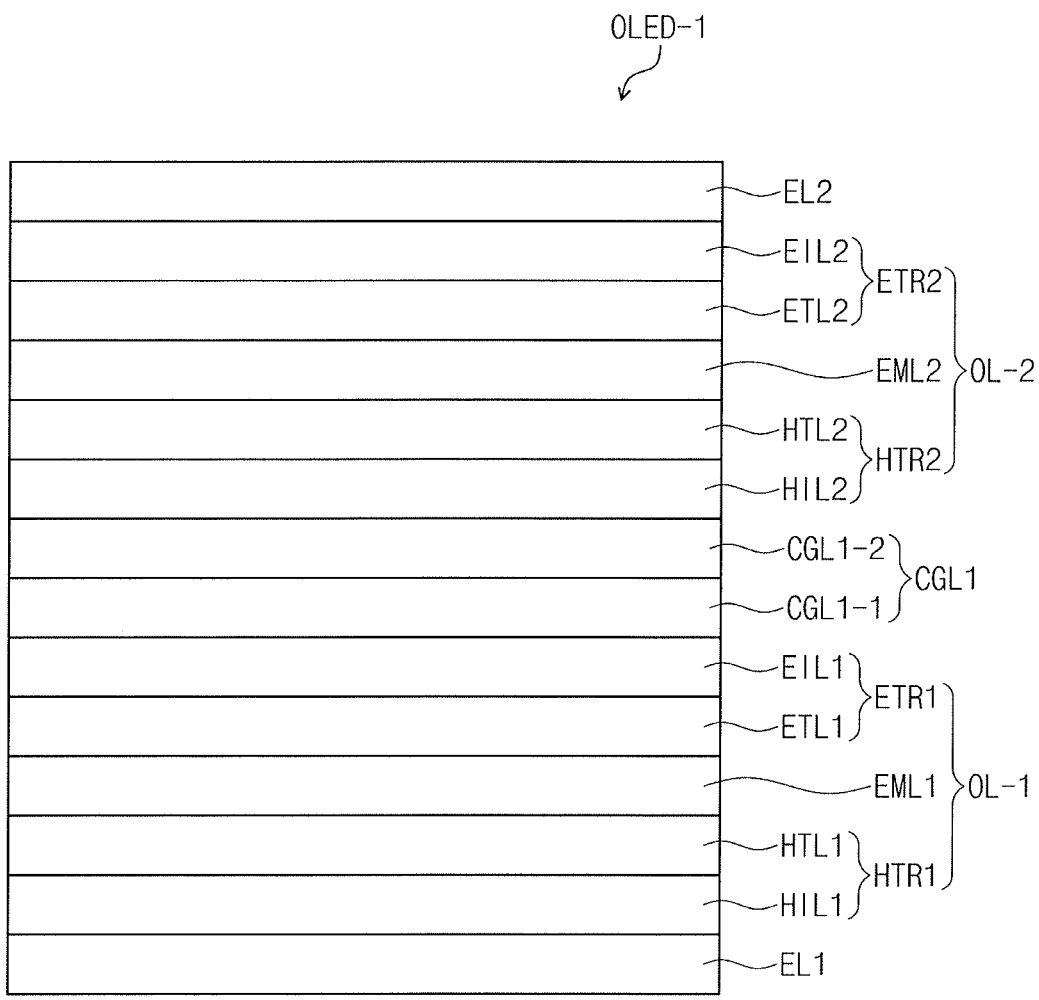
FIG. 2 illustrates a schematic cross-sectional view of a laminated structure of an organic light emitting device according to an embodiment.

FIG. 2 illustrates a schematic cross-sectional view of a laminated structure of an organic light emitting device according to an embodiment.

Referring to FIG. 2, the organic layer OL according to an embodiment may include, e.g., a hole transport region HTR, an electron transport region ETR, and a light emitting layer EML disposed between the hole transport region HTR and the electron transport region ETR. The hole transport region HTR according to an embodiment may include at least one of a hole injection layer HIL or a hole transport layer HTL. In an implementation, the hole transport region HTR may include at least one of a hole buffer layer or an electron blocking layer.

The hole transport region HTR may be a single layer made of a single material, a single layer made of a plurality of different materials, or have a multilayer structure including a plurality of layers made of different materials from each other. For example, as in FIG. 2, the hole transport region HTR may have a structure in which the hole injection layer HIL and the hole transport layer HTL are sequentially stacked. In an implementation, the hole transport region HTR may be formed as a variety of sequentially stacked laminated structures, such as hole injection layer/hole transport layer/hole buffer layer, hole injection layer/hole buffer layer, hole transport layer/hole buffer layer, or hole injection layer/hole transport layer/electron blocking layer.

The hole transport region I-ITR may be formed using a suitable method. In an implementation, the hole transport region HTR may be formed using various methods, e.g., vacuum deposition, spin coating, casting, Langmuir-Blodgett, inkjet printing, laser printing, laser induced thermal imaging (LITI), or the like.

The hole transport layer HTL may include a hole transport material. In an implementation, the hole transport material may include, e.g., a carbazole-based derivative such as n-phenylcarbazole or polyvinylcarbazole, a fluorene-based derivative; a triphenylamine-based derivative such as n,n'-bis(3-methylphenyl)-n,n'-diphenyl-[1,1-biphenyl]-4,4'-diamine (TPD) or 4,4',4"-tris(n-carbazolyl)triphenylamine (TCTA), n,n'-di(1-naphthyl)-n,n'-diphenylbenzidine (NPB), 4,4'-cyclohexylidene bis[n,n-bis(4-methylphenyl)benzenamine] (TAPC), or the like.

The hole injection layer HIL may include a hole injection material. In an implementation, the hole injection material may include, e.g., a phthalocyanine compound such as copper phthalocyanine; n,n'-diphenyl-n,n'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4',4"-tris(n,n-diphenylamino)triphenylamine (TDATA), 4,4',4"-tris {n,-(2-naphthyl)-n-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), (polyaniline)/poly(4-styrenesulfonate) (PANI/PSS), or the like.

In an implementation, in addition to the hole injection layer HIL and the hole transport layer HTL, the hole transport region according to an embodiment may further include at least one of the hole buffer layer or the electron blocking layer. The hole buffer layer may perform the role of increasing the light-emitting efficiency by compensating the wavelength-dependent resonance distance of light emitted from the light emitting layer EML. Material that may be included in the transport region may be used as material included in the hole buffer layer. The electron blocking layer may perform the role of preventing injection of electrons from an electron transport layer into the hole transport layer.

The electron transport region ETR according to an embodiment may include at least one of an electron injection layer EIL or the electron transport layer ETL. In an implementation, the electron transport region ETR may further include a hole blocking layer.

The electron transport region ETR may be formed using a suitable method. In an implementation, the electron transport region ETR may be formed using various methods, e.g., vacuum deposition, spin coating, casting, Langmuir-Blodgett, inkjet printing, laser printing, laser induced thermal imaging (LITI), or the like.

The electron transport layer ETL may include an electron transport material. In an implementation, the electron transport material may include, e.g., tris(8-hydroxyquinolinato) aluminum ($Alq_3$), 1,3,5-tri(1-phenyl-1h-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4h-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate, 9,10-di(naphthalene-2-yl)anthracene ($Bebq_2$), or a mixture thereof.

The electron injection layer EIL may include an electron injection material. In an implementation, the electron injection material may include, e.g., lithium fluoride (LiF), lithium quinolate (LiQ), lithium oxide ($Li_2O$), barium oxide (BaO), sodium chloride (NaCl), cesium fluoride (CsF), a lanthanum group metal such as ytterbium (Yb), a halogenated metal such as rubidium chloride (RbCl) or rubidium iodide (RbI), or the like.

The light emitting layer EML according to an embodiment include a host material and a dopant material. The light emitting layer EML may be formed by using a phosphorescent or fluorescent light emitting material as the dopant in the host material. The light emitting layer EML may emit red, green, and blue light, or the light emitting layer EML may emit yellow light.

The color of the light emitted from the light emitting layer EML may be determined by the combination of the host material and the dopant material. In an example, when the light emitting layer EML emits red light, the light emitting layer EML may include a fluorescent material including tris(dibenzoylmethanato) phenanthroline europium (PBD:$Eu(DBM)_3(Phen)$) or perylene. In an implementation, the dopant material included the light emitting layer EML may be selected from among metal and organometallic complexes, e.g., bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP).

In an implementation, when the light emitting layer EML emits green light, the light emitting layer EML may include a fluorescent material including tris(8-hydroxyquinolino) aluminum ($Alq_3$). In an implementation, the dopant material included in the light emitting layer EML may be selected from among metal and organometallic complexes, e.g., fac-tris(2-phenylpyridine)iridium ($Ir(ppy)_3$).

In an implementation, when the light emitting layer EML emits blue light, the light emitting layer EML may include a fluorescent material selected from the group consisting of spiro-DPVBi, spiro-6P, distyryl-benzene, distyryl-arylene, polyfluorene (PFO)-based polymers, and poly(p-phenylene vinylene) (PPV)-based polymers. In an implementation, the dopant material included in the light emitting layer EML may be selected from among metal and organometallic complexes, e.g., $(4,6-F_2ppy)_2Irpic$.

An organic light emitting device OLED-1 according to an embodiment may have a structure in which a first electrode EL1, a first organic layer OL-1, a first charge generating layer CGL1, a second organic layer OL-2, and a second electrode EL2 are sequentially stacked. In an implementation, as illustrated in FIG. 2, the organic light emitting device OLED-1 may be a front emission type in which the first electrode EL1 is a positive electrode (anode) and the second electrode EL2 is a negative electrode (cathode). In an implementation, the organic light emitting device OLED-1 may be a rear emission type organic light emitting device.

The first organic layer OL-1 may include a first light emitting layer EML (that emits a first light in a first wavelength range), a first hole transport region HTR1 (that transports holes provided from the first electrode EL1 to the first light emitting layer EML1), and a first electron transport region ETR1 (that transports electrons generated from the first charge generating layer CGL1 to the first light emitting layer EML1). In an implementation, as illustrated in FIG. 2, the first hole transport region HTR1 may include a first hole injection layer HIL1 and a first hole transport layer HTL1. In an implementation, one of the first hole transport layer HTL1 or the first hole injection layer HIL1 may be omitted. In an implementation, the first electron transport region ETR1 may include a first electron injection layer EIL1 and a first electron transport layer ETL1. In an implementation, one of the first electron injection layer EIL1 or the first electron transport layer ETL1 may be omitted. In an implementation, the first light in the first wavelength range may be yellow light in the wavelength range of, e.g., about 570 nm to 590 nm.

The first organic layer OL-1 may include a phosphorescent light emitting material. For example, the first light emitting layer EML1 may include the phosphorescent light emitting material. In an implementation, the first light emitting layer EML1 may include a yellow-green light-emitting phosphorescent yellow-green dopant, e.g., 4,4'-n,n'-dicarbazolebiphenyl (CBP) or bis(2-methyl-8-quinolinolato-N1, O8)-(1,1'-biphenyl-4-olato)aluminum (BAlq).

The first sub charge generating layer CGL1-1 may be an n-type charge generating layer that is disposed adjacent to the first organic layer OL-1 and provides electrons to the first organic layer OL-1. The second sub charge generating layer CGL1-2 may be a p-type charge generating layer that is disposed adjacent to the second organic layer OL-2 and provides holes to the second organic layer OL-2. In an implementation, a buffering layer may be further disposed between the first sub charge generating layer CGL1-1 and the second sub charge generating layer CGL1-2.

The second organic layer OL-2 may include a second light emitting layer EML2 (that emits a second light in a second wavelength range), a second hole transport region HTR2 (that transports holes provided from the first charge generating layer CGL1 to the second light emitting layer EML2), and a second electron transport region ETR2 (that transports electrons generated from the second electrode EL2 to the second light emitting layer EML2). In an implementation, as illustrated in FIG. 2, the second hole transport region HTR2 may include a second hole injection layer HIL2 and a second hole transport layer HTL2. In an implementation, one of the second hole transport layer HTL2 or the second hole injection layer HIL2 may be omitted. In an implementation, the second electron transport region ETR2 may include a second electron injection layer EIL2 and a second electron transport layer ETL2. In an implementation, one of the second electron injection layer EIL2 or the second electron transport layer ETL2 may be omitted. The second light in the second wavelength range may have a different wavelength range from the first light emitted by the first light emitting layer EML1. In an implementation, the second light in the second wavelength may be a blue light in the wavelength range of, e.g., about 450 nm to 595 nm.

The second organic layer OL-2 may include a fluorescent light emitting material. For example, the second light emitting layer EML2 may include the fluorescent light emitting material. In an implementation, the second light emitting layer EML2 may include a fluorescent material, e.g., spiro-DPVBi, spiro-6P, DSB, DSA, PFO-based polymers, or PPV-based polymers, in a host including, e.g., CBP or 1,3-bis(carbazol-9-yl) (mCP).

The second organic layer OL-2 may include a first light absorbing dye that absorbs ultraviolet radiation and a portion of visible light. For example, the second organic layer OL-2 includes the first light absorbing dye that absorbs light in the wavelength range of about 380 nm to 410 nm. Herein, a dye absorbing light in the wavelength range of about 380 nm to 410 nm may indicate a dye having a maximum absorption wavelength of about 380 nm to 410 nm.

In the organic light emitting device OLED-1 according to an embodiment, light in the wavelength range of about 380 nm to 410 nm may be absorbed in the second organic layer OL-2. The absorption of light in the wavelength range of about 380 nm to 410 nm in the second organic layer OL-2 adjacent to the second electrode EL2 may help prevent external light in the wavelength range of about 380 nm to 410 nm from entering the first organic layer OL-1. For example, the second organic layer OL-2 may block light in the wavelength range of about 380 nm to 410 nm from reaching the phosphorescent light emitting material in the first light emitting layer EML1.

If light in the wavelength range of about 380 nm to 410 nm were to reach the phosphorescent material included in the first light emitting layer EML1, a large efficiency reduction of the phosphorescent light emitting material could occur. For example, if light in the wavelength range of about 380 to 410 nm were to reach the phosphorescent light emitting material, the driving voltage of the organic light emitting device OLED-1 could undesirably increase and the light emitting efficiency could undesirably decrease. In an implementation, absorption of light in the wavelength range of about 380 nm to 410 nm by the first light absorbing dye included in the second organic layer OL-2 may help prevent the efficiency reduction of the phosphorescent light emitting material. Maintaining the absorption wavelength at about 410 nm or less may help ensure that the effect of preventing efficiency reduction of the phosphorescent light emitting material is sufficient, and may help ensure that absorption does not occur in the blue light wavelength range, thereby helping to prevent a reduction in the light emitting efficiency of the organic light emitting device.

The first light absorbing dye that absorbs light in the wavelength range of about 380 nm to 410 nm may be a suitable dye. In an implementation, the first light absorbing dye may include, e.g., a benzotriazole, a benzophenone, a salicylic acid, a salicylate, a cyanoacrylate, a cinnamate, an oxanilide, a polystylene or polystyrene, a polyferrocenylsilane, a methine, an azomethine, a triazine, a para-aminobenzoic acid, a cinnamic acid, a urocanic acid, or combinations thereof.

In an implementation, the molecular structure of the first light absorbing dye may include at least one of, e.g., a carbazole group, an amine group, or a fluorene group. In an implementation, the first light absorbing dye may be represented by Formula 1 below.

[Formula 1]

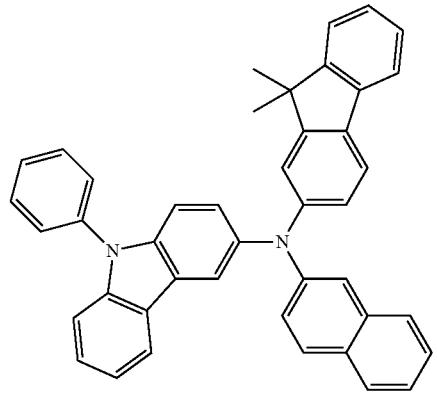

In an implementation, one first light absorbing dye may be used, or a combination of two or more types of the first light absorbing dye may be used. In an implementation, the effect of absorbing light in the wavelength range of about 380 nm to 410 nm may be achieved using one type of the first light absorbing dye. In an implementation, the effect of absorbing light in the wavelength range of about 380 nm to 410 nm may also be achieved by combining two or more types of the first light absorbing dye.

In an implementation, the first light absorbing dye may be included in the second hole transport region HTR2 in the second organic layer OL-2. In an implementation, the first light absorbing dye may be included in the second hole transport layer HTL2. In an implementation, the first light absorbing dye may be included in other layers included in the second organic layer OL-2. In an implementation, the first light absorbing dye may be included in each of the plurality of layers included in the second organic layer OL-2.

In an implementation, the second organic layer OL-2 may have a transmittance of at most about 10% with respect to light in the wavelength range of about 380 nm to 410 nm. To help ensure that the second organic layer OL-2 has a transmittance of about 10% or less with respect to light in the wavelength range of about 380 nm to 410 nm, at least one layer including the first light absorbing dye may be included in the second organic layer OL-2. In an implementation, the layer including the first light absorbing dye may have a thickness of about 10 nm to 150 nm. Maintaining the thickness of the layer including the first light absorbing dye at about 10 nm or greater helps ensure that a a transmittance of 10% or less with respect to light in the wavelength range of about 380 nm to 410 nm is achieved. Maintaining the thickness at about 150 nm or less may help prevent an increase in the driving voltage. The first light absorbing dye being included in a single layer included in the second organic layer OL-2 may cause the second organic layer OL-2 to have a transmittance of about 10% or less with respect to light in the wavelength range of about 380 nm to 410 nm, or the first light absorbing dye being included in a plurality of layers included in the second organic layer OL-2 may cause the second organic layer OL-2 to have a transmittance of about 10% or less with respect to light in the wavelength range of about 380 nm to 410 nm.

Figure 3:
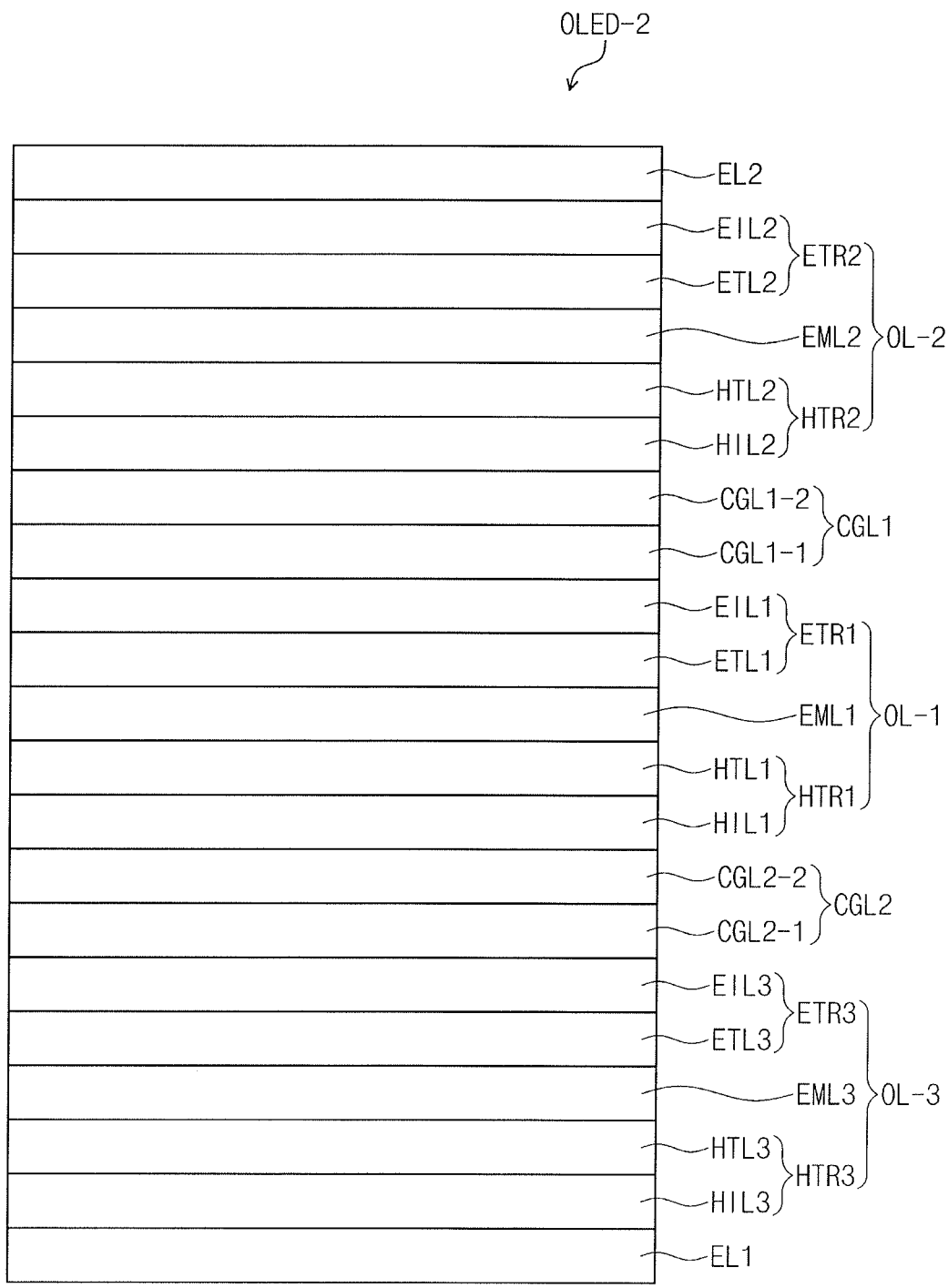
FIG. 3 illustrates a schematic cross-sectional view of a laminated structure of an organic light emitting device according to an embodiment.

FIG. 3 illustrates a schematic cross-sectional view of a laminated structure of an organic light emitting device according to an embodiment.

Referring to FIG. 3, the organic light emitting device OLED-2 according to an embodiment may include three organic layers OL. For example, in addition to the two organic layers OL included in the organic light emitting device OLED illustrated in FIG. 1, the organic light emitting device OLED-2 according to the present embodiment may further include a third organic layer OL-3 between the first electrode EL1 and the first organic layer OL-1. A second charge generating layer CGL2 may be further included between the first organic layer OL-1 and the third organic layer OL-3.

The first organic layer OL-1, the second organic layer OL-3, and the third organic layer OL-3 may emit red, green, and blue light, respectively, or may emit yellow light. In an implementation, the wavelengths or order of lights respectively emitted by each of the organic layers OL may be selected such that white light may be produced by combining the lights.

The third sub charge generating layer CGL2-1 may be an n-type charge generating layer that is disposed adjacent to the third organic layer OL-3 and provides electrons to the third organic layer OL-3. The fourth sub charge generating layer CGL2-2 may be a p-type charge generating layer that is disposed adjacent to the first organic layer OL-1 and provides holes to the first organic layer OL-21. In an implementation, a buffering layer may be further disposed between the third sub charge generating layer CGL2-1 and the fourth sub charge generating layer CGL2-2.

The third organic layer OL-3 may include a fluorescent light emitting material. For example, a third light emitting layer EML3 may include the fluorescent light emitting material. In an implementation, the third light emitting layer EML3 may include a fluorescent material, e.g., spiro-DPVBi, spiro-6P, DSB, DSA, PFO-based polymers, or PPV-based polymers, in a host including, e.g., CBP or mCP. The fluorescent light emitting material included in the third organic layer OL-3 may be the same or different from the fluorescent light emitting material included in the second organic layer OL-2.

In an implementation, the third organic layer OL-3 may include a phosphorescent light emitting material. For example, the third light emitting layer EML3 may include the phosphorescent light emitting material. In an implementation, the third light emitting layer EML3 may include a phosphorescent dopant in a host, e.g., CBP or Balq.

As described with reference to FIG. 2, the second organic layer OL-2 may include the first light absorbing dye that absorbs light in the wavelength range of about 380 nm to 410 nm. Light in the wavelength range of about 380 nm to 410 nm may be absorbed in the second organic layer OL-2 adjacent to the second electrode EL2, and thus external light in the wavelength range of about 380 nm to 410 nm may advantageously prevented from entering the first organic layer OL-1 and the third organic layer OL-3.

If ultraviolet radiation or a portion of visible light were to be emitted or incident onto a phosphorescent light emitting material included in a light emitting layer, the phosphorescent light emitting material could be damaged such that there could be a limitation in that the light emitting efficiency of the organic light emitting device could decrease significantly and the driving voltage increases. For example, light in the wavelength range of about 380 nm to 410 nm entering from the outside could damage the phosphorescent light emitting material, thereby reducing light emitting efficiency. Thus, there could be a limitation in that the light emitting efficiency could significantly decrease and the driving voltage could increase in the organic light emitting device. According to an embodiment, the first light absorbing dye included in the second organic layer OL-2 may absorb the light (e.g., external light) in the wavelength range of about 380 nm to 410 nm, and thus a reduction in the efficiency of the phosphorescent light emitting materials respectively included in the first light emitting layer EML1 and the third light emitting layer EML3 may be prevented.

Figure 4:
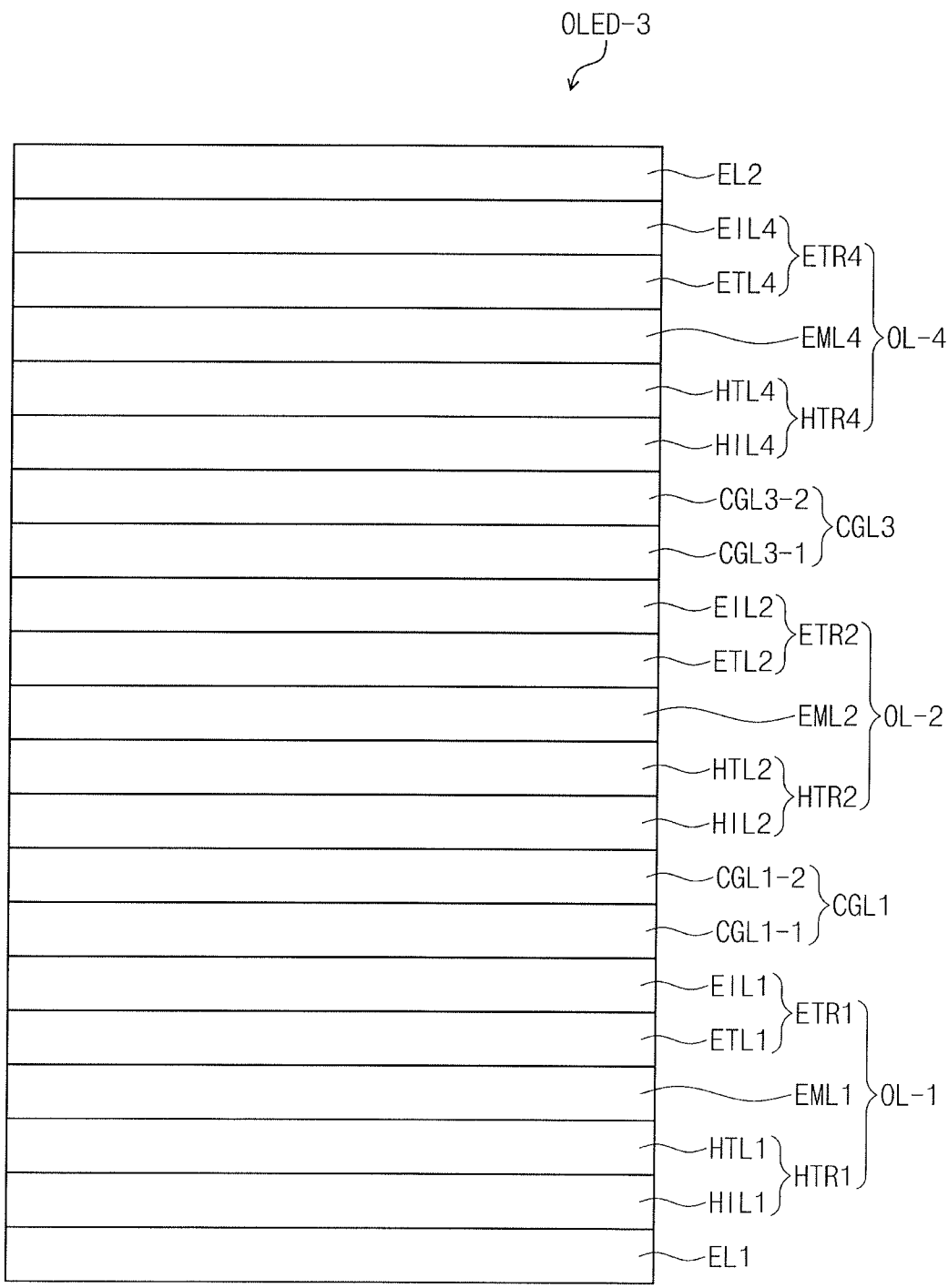
FIG. 4 illustrates a schematic cross-sectional view of a laminated structure of an organic light emitting device according to another embodiment.

FIG. 4 illustrates a schematic cross-sectional view of a laminated structure of an organic light emitting device according to another embodiment.

Referring to FIG. 4, the organic light emitting device OLED-3 according to an embodiment may include three organic layers OL. For example, in addition to the two organic layers OL included in the organic light emitting device OLED illustrated in FIG. 1, the organic light emitting device OLED-3 according to the present embodiment may further a include fourth organic layer OL-4 between the second electrode EL2 and the second organic layer OL-2. A third charge generating layer CGL3 may be further included between the second organic layer OL-2 and the fourth organic layer OL-4.

In an implementation, the first organic layer OL-1, the second organic layer OL-2, and the fourth organic layer OL-4 may emit red, green, and blue light, respectively, or may emit yellow light. In an implementation, the wavelengths or order of lights respectively emitted by each of the organic layers OL may be suitably selected when white light may be produced by combining the lights.

In an implementation, the fifth sub charge generating layer CGL3-1 may be an n-type charge generating layer that is disposed adjacent to the second inorganic layer OL-2 and provides electrons to the second organic layer OL-2. The sixth sub charge generating layer CGL3-2 may be a p-type charge generating layer that is disposed adjacent to the fourth organic layer OL-4 and provides holes to the fourth organic layer OL-4. In an implementation, a buffering layer may be further disposed between the fifth sub charge generating layer CGL3-1 and the sixth sub charge generating layer CGL3-2.

The fourth organic layer OL-4 may include a fluorescent light emitting material. For example, a fourth light emitting layer EML4 may include the fluorescent light emitting material. In an implementation, the fourth light emitting layer EML4 may include a fluorescent material, e.g., spiro-DPVBi, spiro-6P, DSB, DSA, PFO-based polymers, or PPV-based polymers, in a host, e.g., CBP or mCP. The fluorescent light emitting material included in the fourth organic layer OL-4 may be the same or different from the fluorescent light emitting material included in the second organic layer OL-2.

As described with reference to FIG. 2, the second organic layer OL-2 may include the first light absorbing dye which absorbs light in the wavelength range of about 380 nm to 410 nm. In addition, the fourth organic layer OL-4 may include a second light absorbing dye that includes light in the wavelength range of about 380 nm to 410 nm. By including the second light absorbing dye, the fourth organic layer OL-4 adjacent to the second electrode EL2 may help prevent light in the wavelength range of about 380 nm to 410 nm from entering the first organic layer OL-1. The second light absorbing dye that absorbs light in the wavelength range of about 380 nm to 410 nm may be a suitable dye. The second light absorbing dye may be the same or different from the first light absorbing dye.

If ultraviolet radiation or a portion of visible light were to be emitted or incident onto a phosphorescent light emitting material included in a light emitting layer, the phosphorescent light emitting material could be damaged such that there could be a limitation in that the light emitting efficiency of the organic light emitting device decreases significantly and the driving voltage increases. For example, light, in the wavelength range of about 380 nm to 410 nm, entering from the outside could damage the phosphorescent light emitting material, thereby reducing light emitting efficiency, and thus there could be a limitation in that the light emitting efficiency significantly decreases and the driving voltage increases in the organic light emitting device. According to an embodiment, the first light absorbing dye included in the second organic layer OL-2 may absorb light in the wavelength range of about 380 nm to 410 nm, and thus a reduction in the efficiency of the phosphorescent light emitting materials respectively included in the first light emitting layer EML1 and the third light emitting layer EML3 may be prevented.

Hereinafter, description is given of display device according to an embodiment.

Figure 5:
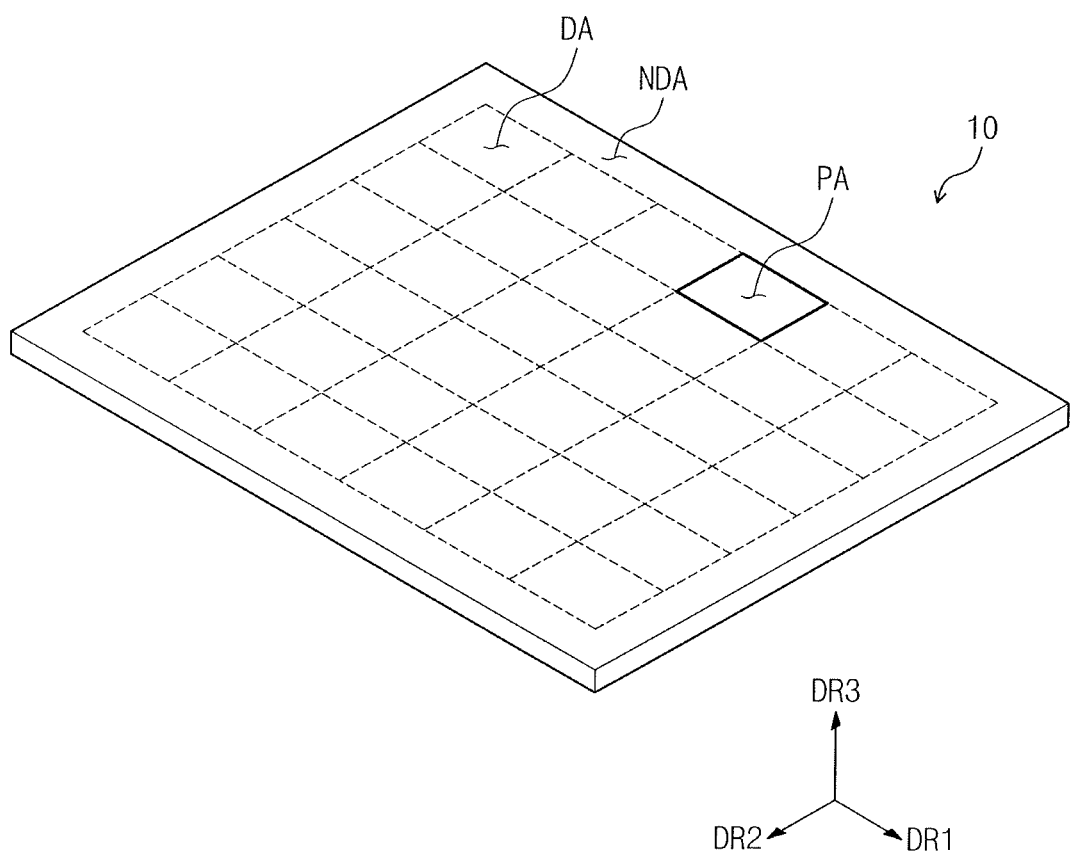
FIG. 5 illustrates a schematic perspective view of a display device according to an embodiment.

FIG. 5 illustrates a perspective view of a display device according to an embodiment.

Referring to FIG. 5, a display device 10 according to an embodiment may include a display area DA and a non-display area NDA. The display area DA displays an image. In an implementation, when viewed in the thickness direction of the display device 10, the display area DA may have an approximately rectangular shape.

The display area DA may include a plurality of pixel areas PA. The pixel areas PA may be arranged in matrix form. The pixel areas PA may be defined by a pixel defining layer (PDL in FIG. 8A). The pixel areas PA may include respective pixels among a plurality of pixels (PX in FIG. 6). Each of the pixels may include an organic light emitting device (OLED in FIG. 1).

The non-display area NDA may not display an image. When viewed in the thickness direction DR3 of the display device 10, the non-display area NDA may, e.g., surround the display area DA. The non-display area NDA may be adjacent to the display area DA in a first direction DR1 and a second direction DR2.

Figure 6:
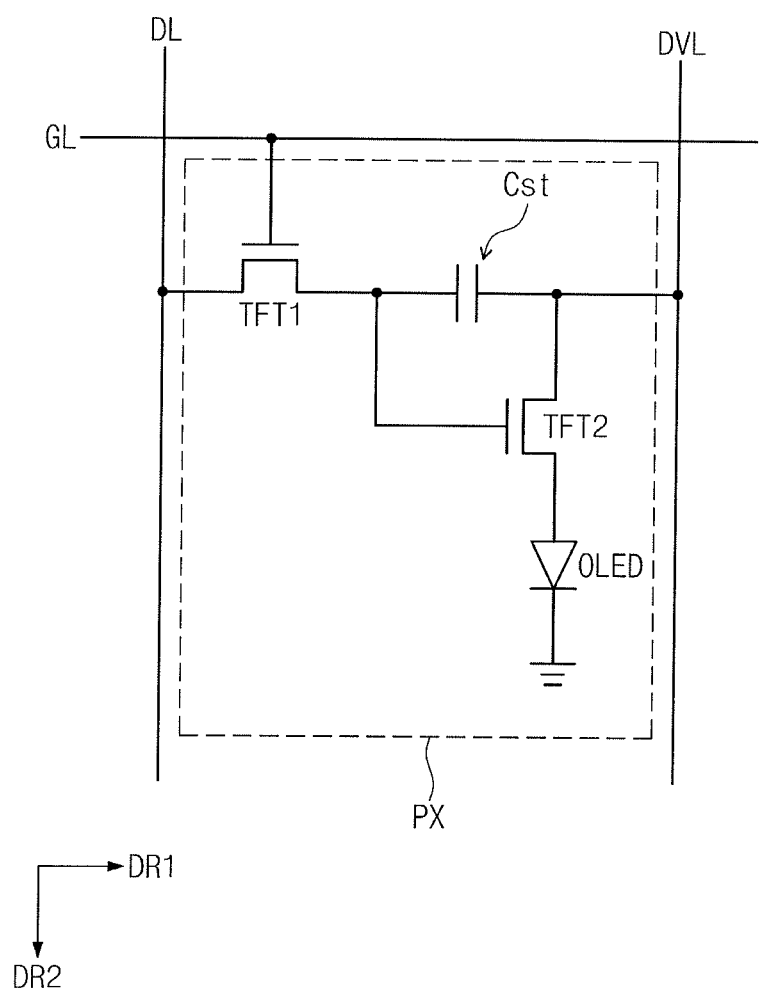
FIG. 6 illustrates a circuit diagram of one of pixels included in a display device according to an embodiment.
Figure 7:
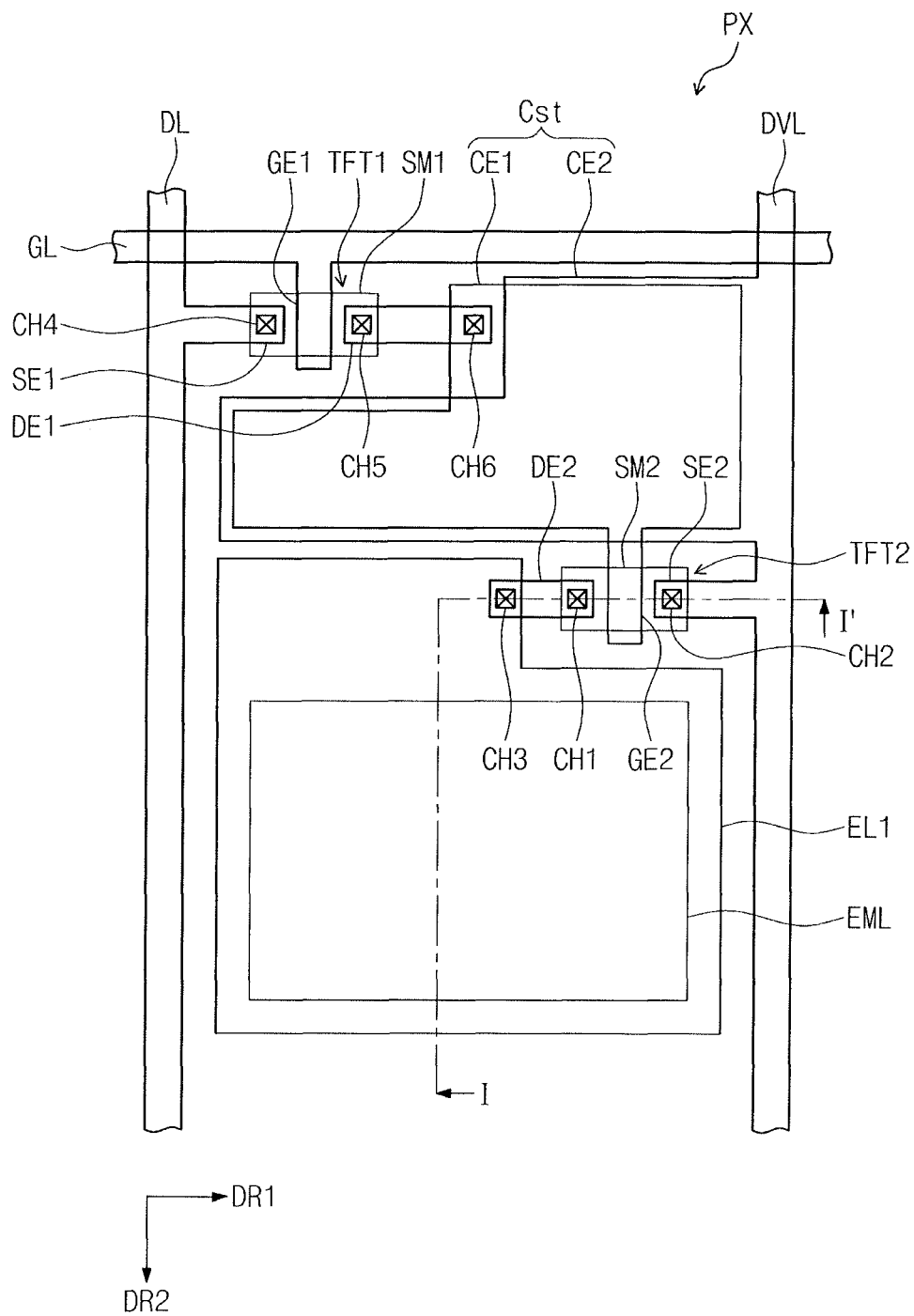
FIG. 7 illustrates a plan view of one of pixels included in a display device according to an embodiment.
Figure 8A:
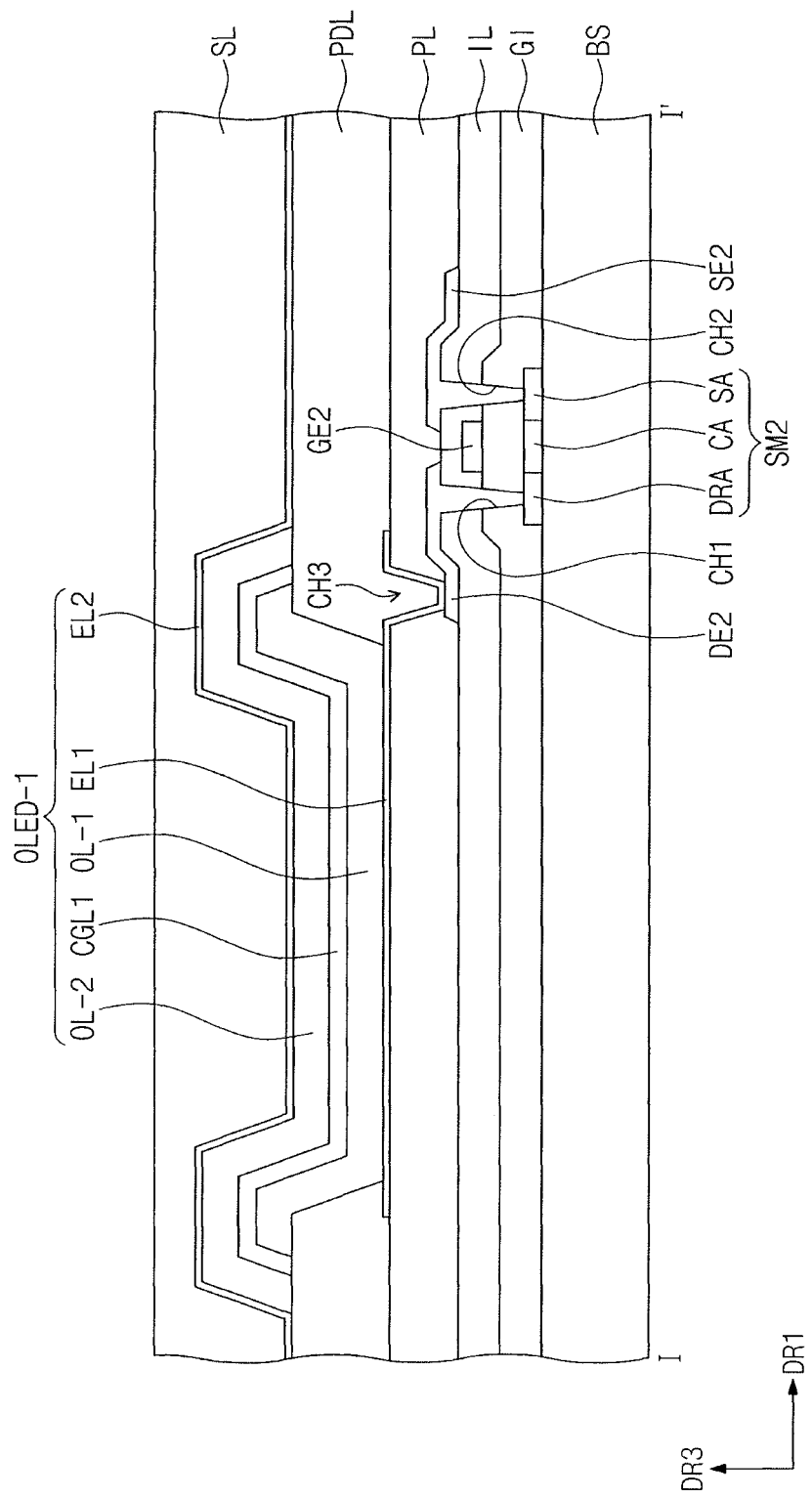
FIGS. 8A to 8C illustrate schematic cross-sectional views taken along I-I' in FIG. 7.
Figure 8B:
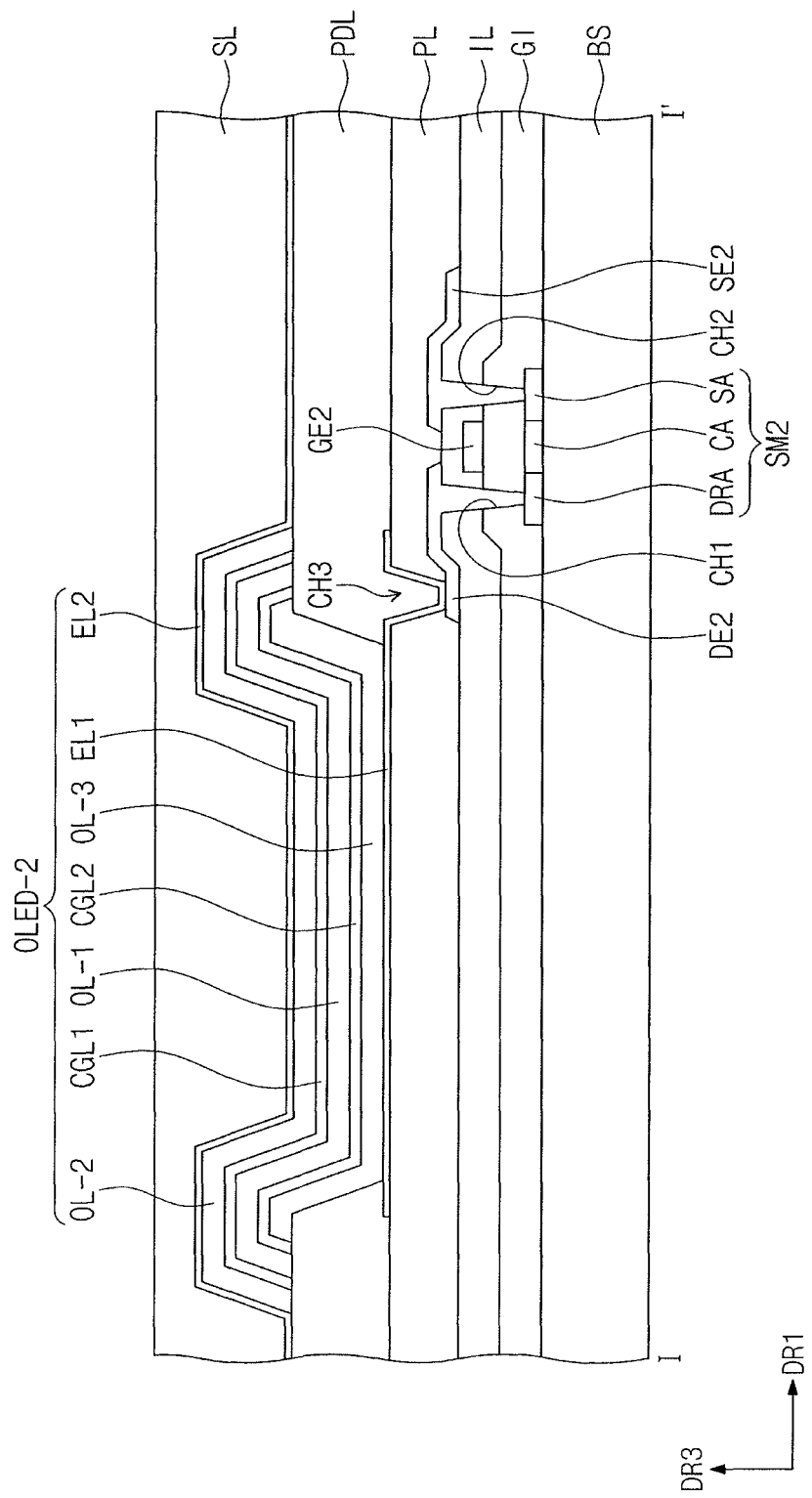
Figure 8C:
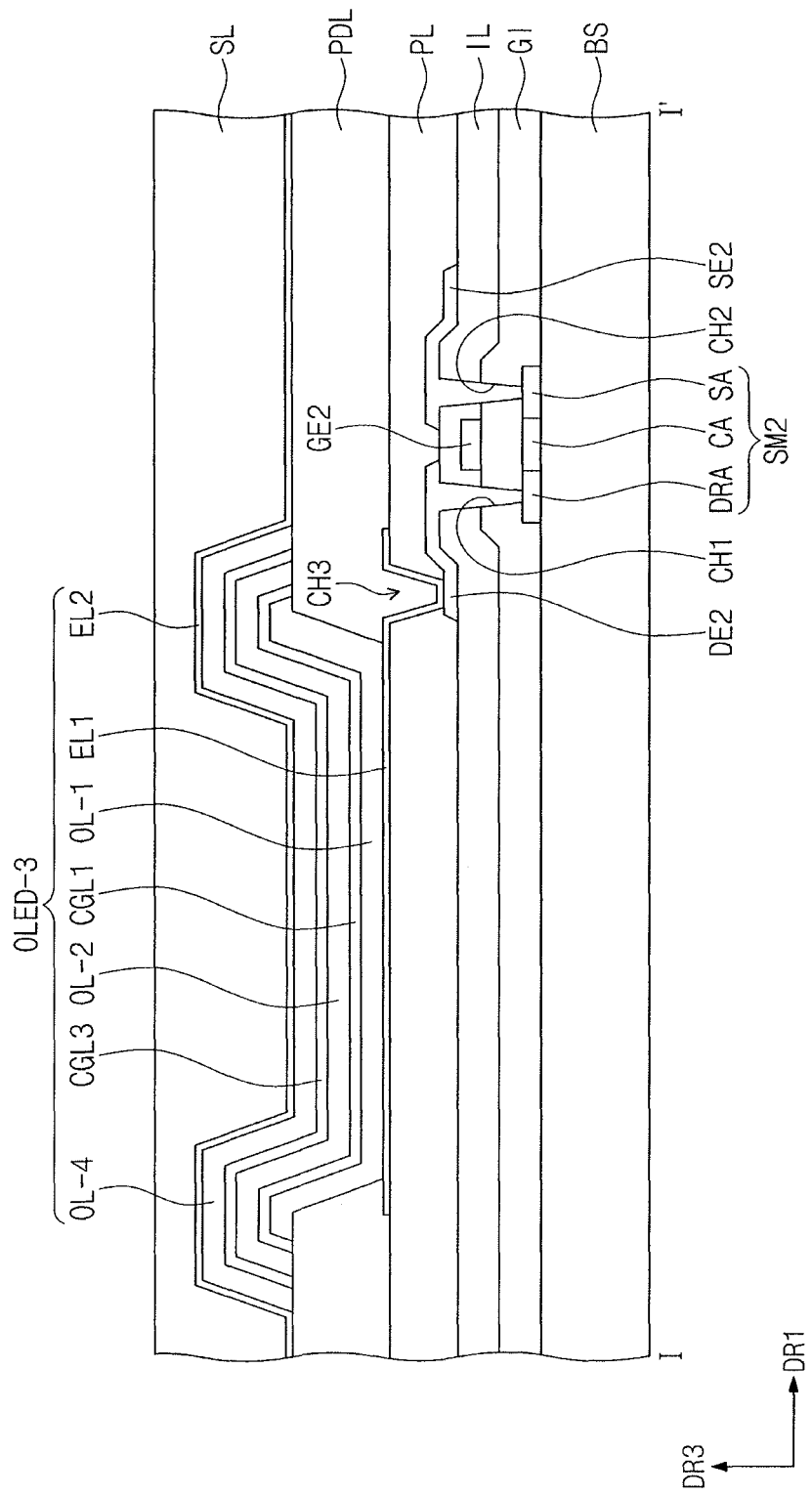

FIG. 6 illustrates a circuit diagram of one of pixels included in a display device according to an embodiment. FIG. 7 illustrates a plan view of one of pixels included in a display device according to an embodiment. FIGS. 8A to 8C illustrate schematic cross-sectional views taken along I-I' in FIG. 7.

Referring to FIGS. 1 to 8A, each of pixels PX may be connected to a wiring part composed of a gate line GL, a data line DL, and a driving voltage line DVL. Each of the pixels PX includes thin film transistors TFT1 and TFT2 connected to the wiring part, an organic light emitting device OLED-1 connected to the thin film transistors TFT1 and TFT2, and a capacitor Cst. Each of the pixels PX may emit light of a predetermined color, for example, one among red light, green light, blue light, white light, yellow light, cyan light, etc.

In an implementation, as illustrated in FIG. 6, each of the pixels PX may have a rectangular shape on a plane. In an implementation, each of the pixels PX may have at least one shape among a circle, an ellipse, a square, a quadrilateral, a trapezoid, and a rhombus. Moreover, on a plane, each of the pixels PX may, for example, have the shape of a rectangle with rounded corners.

The gate line GL extends in the first direction DR1. The data line DL extends in the second direction DR2 intersecting the gate line GL. The driving voltage line DVL extends in substantially the same direction as the data line DL, that is, the second direction DR2. The gate line GL sends a scanning signal to the thin film transistors TFT1 and TFT2, the data line DL sends a data signal to the thin film transistors TFT1 and TFT2, and the driving voltage line DVL provides a driving voltage to the thin film transistors TFT1 and TFT2.

The thin film transistors TFT1 and TFT2 include a driving thin film transistor TFT2 for controlling the organic light emitting device OLED-1, and a switching thin film transistor TFT1 for switching the driving thin film transistor TFT2. In an implementation, each of the pixels PX are described as including two of the thin film transistors TFT1 and TFT2. In an implementation, each of the pixels PX may also have one thin film transistor and capacitor. Each of the pixels PX may also be provided with three or more thin film transistors and two or more capacitors.

The switching thin film transistor TFT1 includes a first gate electrode GE1, a first source electrode SE1, and a first drain electrode DE1. The first gate electrode GE1 is connected to the gate line GL, and the first source electrode SE1 is connected to the drain line DL. The first drain electrode DE1 is connected via a fifth contact hole CH5 to a first common electrode CE1. The switching thin film transistor TFT1 sends to the driving thin film transistor TFT2, the data signal which is applied to the data line DL in response to the scanning signal applied to the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected via a third contact hole CH3 with a first electrode EL1.

The capacitor Cst is connected between the second gate electrode GE2 and the second source electrode SE2 of the driving thin film transistor TFT2, and is charged with and maintains the data signal input to the second gate electrode GE2 of the driving thin film transistor TFT2. The capacitor Cst may include the first common electrode CE1, which is connected via a sixth contact hole CH6 with the first drain electrode DE1, and a second common electrode CE2, which is connected with the driving voltage line DVL.

The display device 10 according to an embodiment includes a base substrate BS on which the thin film transistors TFT1 and TFT2 and the organic light emitting device OLED-1 are laminated. The base substrate BS may be a suitable substrate. For example, the base substrate BS may be formed of an insulating material such as glass, plastic, or quartz. Organic polymers forming the base substrate BS may include polyethylene terephthalate (PET), polyethylene naphthalate (PEN), polyimide, polyethersulfone, etc. The base substrate BS may be selected by taking into consideration mechanical strength, thermal stability, transparency, surface flatness, ease of handling, waterproofness, etc.

In an implementation, a substrate buffer layer may be disposed on the base substrate BS. The substrate buffer layer may help prevent impurities from diffusing to the switching thin film transistor TFT1 and the driving thin film transistor TFT2. The substrate buffer layer may be formed of a silicon nitride (SiNx), a silicon oxide (SiOx), a silicon oxynitride (SiOxNy) etc., and may be omitted depending on the base substrate BS material and the process conditions.

A first semiconductor layer SM1 and a second semiconductor layer SM2 are disposed on the base substrate BS. The first semiconductor layer SM1 and the second semiconductor layer SM2 are formed of semiconductor materials, and operate as active layers for the switching thin film transistor TFT1 and the driving thin film transistor TFT2, respectively. Each of the first semiconductor layer SM1 and the second semiconductor layer SM2 includes a source area SA, a drain area DRA, and a channel area CA disposed between the source area SA and the drain area DRA. Each of the first semiconductor layer SM1 and the second semiconductor SM2 may be formed of one selected from among an inorganic semiconductor or an organic semiconductor. The source area SA and the drain area DRA may be doped with an n-type impurity or a p-type impurity.

A gate insulating layer GI is disposed on the first semiconductor layer SM1 and the second semiconductor layer SM2. The gate insulating layer GI covers the first semiconductor layer SM1 and the second semiconductor layer SM2. The gate insulating layer GI may include at least one of an organic insulating material or an inorganic insulating material.

The first gate electrode GE1 and the second gate electrode GE2 are disposed on the gate insulating layer GI. The first gate electrode GE1 and the second gate electrode GE2 are formed so as to cover an area corresponding to the channel area CA in the first semiconductor layer SM1 and the second semiconductor layer SM2, respectively.

The first source electrode SE1 and the first drain electrode DE1, and the second source electrode SE2 and the second drain electrode DE2 are disposed on an interlayer insulating layer IL. The second drain electrode DE2 contacts the drain area DRA of the second semiconductor layer SM2 via a first contact hole CH1 formed in the gate insulating layer GI and the interlayer insulating layer IL. The second source electrode SE2 contacts the source area SA of the second semiconductor layer SM2 via a second contact hole CH2 formed in the gate insulating layer GI and the interlayer insulating layer IL. The first source electrode SE1 contacts the source area of the first semiconductor layer SM1 via a fourth contact hole CH4 formed in the gate insulating layer GI and the interlayer insulating layer IL. The first drain electrode DE1 contacts the drain area of the first semiconductor layer SM1 via the fifth contact hole CH5 formed in the gate insulating layer GI and the interlayer insulating layer IL.

A passivation layer PL is formed on the first source electrode SE1 and the first drain electrode DE1, and the second source electrode SE2 and the second drain electrode DE2. The passivation layer PL may perform the role of a protective film that protects the switching thin film transistor TFT1 and the driving thin film transistor TFT2, and may also perform the role of a flattening film that flattens the top face thereof.

The first electrode EL1 is disposed on the passivation layer PL. The first electrode EL1 may be, e.g., a pixel electrode or a positive electrode. The first electrode EL1 may be connected to the second drain electrode DE2 in the driving thin film transistor TFT2 via the third contact hole CH3 formed in the passivation layer PL.

A first organic layer OL-1 may be disposed on the first electrode EL1. The first organic layer OL-1 may include a first hole transport region HTR1, a first light emitting layer EML1, and a first electron transport region ETR1. The first hole transport region HTR1 may include at least one of a first hole injection layer HIL1 or a first hole transport layer HTL1. The first electron transport region ETR1 may include at least one of a first electron transport layer ETL1 or a first electron injection layer EIL1.

A second organic layer OL-2 may be disposed on the first organic layer OL-1. The second organic layer OL-2 may include a second hole transport region HTR2, a second light emitting layer EML2, and a second electron transport region ETR2. The second hole transport region HTR2 may include at least one of a second hole injection layer HIL2 or a second hole transport layer HTL2. The second electrode transport region ETR2 may include at least one of a second electron transport layer ETL2 or a second electron injection layer EIL2.

A first charge generating layer CGL1 may be disposed between the first organic layer OL-1 and the second organic layer OL-2. The first charge generating layer CGL1 may provide generated electrons and holes to each of the organic layers OL-1 and OL-2.

A second electrode EL2 may be disposed on the second organic layer OL-2. The second electrode EL2 may be a common electrode or a negative electrode. In an implementation, the second electrode EL2 may be connected with an auxiliary electrode.

When the organic light emitting device OLED-1 is a front emission type, the first electrode EL1 may be a reflective-type electrode and the second electrode EL2 may be a transmissive or semi-transmissive-type electrode. A phosphorescent light emitting material may be included in the first organic layer OL-1. A first light absorbing dye that absorbs ultraviolet radiation and a portion of visible light may be included in the second organic layer OL-2. For example, the first light absorbing dye that absorbs light in the wavelength range of about 380 nm to 410 nm is included in the second organic layer OL-2. The absorption of light in the wavelength range of about 380 nm to 410 nm in the second organic layer OL-2 adjacent to the second electrode EL2 may help prevent external light in the wavelength range of about 380 nm to 410 nm from entering or reaching the first organic layer OL-1. For example, the second organic layer OL-2 may block light in the wavelength range of about 380 nm to 410 nm from reaching the phosphorescent material included in the first light emitting layer EML1.

If light in the wavelength range of about 380 nm to 410 nm were to reach the phosphorescent material included in the first light emitting layer EML1, a large efficiency reduction of the phosphorescent light emitting material could occur. For example, if light in the wavelength range of about 380 nm to 410 nm were to reach the phosphorescent light emitting material, the driving voltage of the organic light emitting device OLED-1 could increase and the light emitting efficiency could increase. According to an embodiment, absorption of light in the wavelength range of about 380 nm to 410 nm by the first light absorbing dye included in the second organic layer OL-2 may help prevent the undesirable efficiency reduction of the phosphorescent light emitting material. If the absorbed wavelength were to exceed about 410 nm, the effect of preventing efficiency reduction of the phosphorescent light emitting material could be insignificant, and furthermore, absorption could occur in the blue light wavelength range such that the light emitting efficiency of the organic light emitting device could be reduced.

The first light absorbing dye that absorbs light in the wavelength range of about 380 nm to 410 nm may be a suitable dye. In an implementation, the first light absorbing dye may include, e.g., benzotriazoles, benzophenones, salicylic acids, salicylates, cyanoacrylates, cinnamates, oxanilides, polystylenes, polyferrocenylsilanes, methines, azomethines, triazines, para-aminobenzoic acids, cinnamic acids, urocanic acids, or combinations thereof.

In an implementation, the molecular structure of the first light absorbing dye may include, e.g., a carbazole group, an amine group, or a fluorene group. In an implementation, the first light absorbing dye may be represented by Formula 1 below.

[Formula 1]

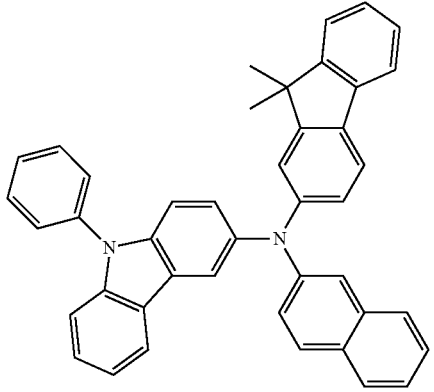

When the organic light emitting device OLED-1 is a rear emission type, the first electrode EL1 may be a transmissive or semi-transmissive-type electrode, and the second electrode EL2 may be a reflective-type electrode. In this case, unlike when the organic light emitting device OLED-1 is a front emission type, a phosphorescent light emitting material may be included in the second organic light emitting material OL-2, and a first light emitting dye that absorbs light in the wavelength range of about 380 nm to 410 nm is included in the first organic layer OL-1.

Hereinafter, description pertains to cases in which the organic light emitting device is a front emission type. In an implementation, the organic light emitting device may be a rear emission type. In this case, the order of stacking of the electrodes EL, organic layers OL, and charge generating layers CGL may be different.

Referring to FIG. 8B, the organic light emitting device OLED-2 may include three organic layers OL. For example, in addition to the two organic layers OL illustrated in FIG. 8A, the organic light emitting device OLED-2 according to an embodiment may further include a third organic layer OL-3 between the first electrode EL1 and the first organic layer OL-1. A second charge generating layer CGL2 may be further included between the first organic layer OL-1 and the third organic layer OL-2.

The third organic layer OL-3 may include a phosphorescent light emitting material or a fluorescent light emitting material. When the phosphorescent light emitting material is included in the third organic layer OL-3, light in the wavelength range of about 380 nm to 410 nm may be blocked from reaching the third organic layer OL-3 by the first light absorbing dye included in the second organic layer OL-2. Accordingly, efficiency reduction of the phosphorescent light emitting material included in the third organic layer OL-3 may be prevented, and an increase in the driving voltage of the organic light emitting device OLED-2 may be prevented.

Referring to FIG. 8C, the organic light emitting device OLED-3 may include three organic layers OL. For example, in addition to the two organic light emitting layer OL included in the organic light emitting device OLED-3 illustrated in FIG. 1, the organic light emitting device OLED-3 according to the present embodiment may further include a fourth organic layer OL-4 between the second electrode EL2 and the second organic layer OL-2. A third charge generating layer CGL3 may be further included between the second organic layer OL-2 and the fourth organic layer OL-4.

The fourth organic layer OL-4 may include a fluorescent light emitting material. For example, the fourth organic layer OL-4 may include a second light absorbing dye that absorbs light in the wavelength range of about 380 nm to 410 nm. By including the second light absorbing dye, the fourth organic layer OL-4 adjacent to the second electrode EL2 may prevent light in the wavelength range of about 380 nm to 410 nm from entering the first organic layer OL-1. The second light absorbing dye that absorbs light in the wavelength range of about 380 nm to 410 nm may be a suitable dye. The second light absorbing dye may be the same or different from the first light absorbing dye.

If ultraviolet radiation or a portion of visible light were to be emitted or incident onto a phosphorescent light emitting material included in a light emitting layer, the phosphorescent light emitting material could damaged such that there could be a limitation in that the light emitting efficiency of the organic light emitting device decreases significantly and the driving voltage increases. For example, light, in the wavelength range of about 380 nm to 410 nm entering from the outside could damage the phosphorescent light emitting material, thereby reducing light emitting efficiency, and thus there could be a limitation in that the light emitting efficiency significantly decreases and the driving voltage increases in the organic light emitting device. According to an embodiment, the first light absorbing dye included in the second organic layer OL-2 may absorb light in the wavelength range of about 380 nm to 410 nm, and thus a reduction in the efficiency of the phosphorescent light emitting materials respectively included in the first light emitting layer EML1 and the third light emitting layer EML3 may be advantageously prevented.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

ITO was used to form a positive electrode on a glass substrate. A first organic layer was formed by forming in sequence, a hole injection layer composed of 2-TNATA, a hole transport layer composed of n,n'-bis(3-methylphenyl)-n,n'-diphenyl-[1,1-biphenyl]-4,4'-diamine (TPD), a light emitting layer composed of bis(2-methyl-8-quinolinolato-N1,O8)-(1,1'-biphenyl-4-olato)aluminum (BAlq) doped with yellow-green dopant, an electron transport layer composed of Alq3, and an electron injection layer composed of LiF. A Li-doped n-type charge generating layer and a p-type charge generating layer were deposited on the first organic layer to form a charge generating layer. On the charge generating layer were formed a hole injection layer composed of 2-TNATA and a hole transport layer composed of a compound represented by Formula 1 below. Next, a second organic layer was completed by sequentially forming on the hole transport layer, a light emitting layer composed of a host which is doped with blue dopant and includes 4,4'-n,n'-dicarbazolebiphenyl (CBP), an electron transport layer composed of Alq3, and an electron injection layer composed of LiF. Al was then used to form a negative electrode on the second organic layer.

[Formula 1]

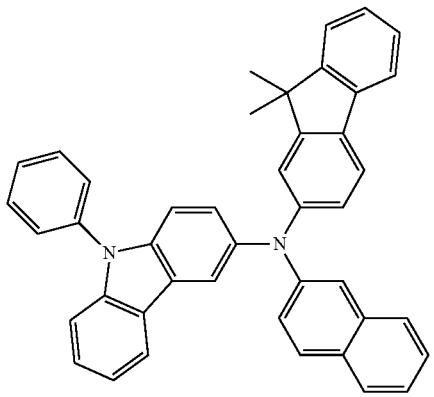

Comparative Example 1

A device was prepared in the same manner as in Example 1 except that the compound represented by Formula 1 was not inserted into the hole transport layer.

Experimental Results

After exposing the organic light emitting devices manufactured according to Example 1 and Comparative Example 1 to sunlight for 96 hours, the driving voltage and light emitting efficiencies before and after being exposed to sunlight were compared. The driving voltage and light emitting efficiency were measured when operating at a current density of 10 $mA/cm^2$.

TABLE 1

| | Current density ($mA/cm^2$) | Driving voltage (V) | | Light emitting efficiency (cd/A) | |
|---|---|---|---|---|---|
| | | Before exposure | After exposure | Before exposure | After exposure |
| Comparative Example 1 | 10 | 15 | 17 | 65 | 35 |
| Example 1 | 10 | 15 | 15 | 64 | 51 |

Figure 9:
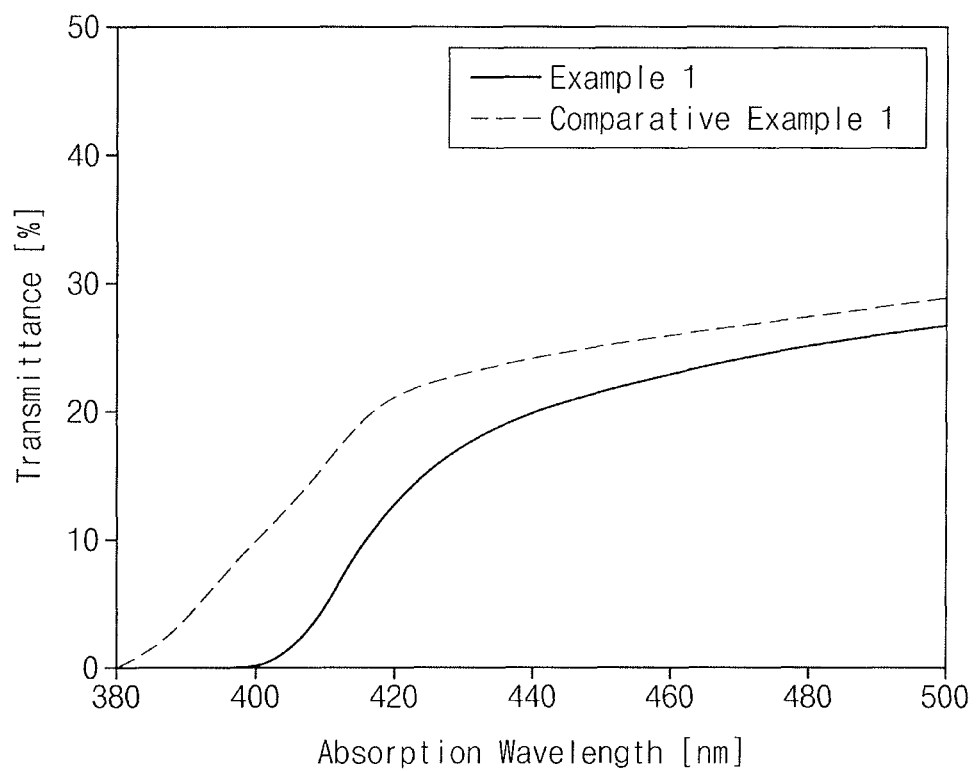
FIG. 9 illustrates a graph of transmittance according to wavelength range for Example 1 and Comparative Example 1, respectively.

FIG. 9 illustrates a graph showing transmittance according to wavelength range for Example 1 and Comparative Example 1, respectively. From the results of FIG. 9, it may be seen that a light absorbing effect may be achieved for light in the wavelength range of about 380 nm to 410 nm by using a light absorbing dye in the hole transport layer of the second organic layer.

Referring to Table 1, it may be seen that in Comparative Example 1, when operating after exposure to sunlight for 96 hours, the driving voltage was increased and the light emitting efficiency was decreased by about ½. It may be seen that in Example 1, when operating after exposure to sunlight for 96 hours, the driving voltage did not increase and the decrease in light emitting efficiency was about half that of Comparative Example 1.

An organic light emitting device according to an embodiment may help prevent damage to a light emitting layer by blocking ultraviolet radiation and a portion of visible light entering from the outside of the device.

A display device according to an embodiment may help prevent a reduction in light emitting efficiency by blocking ultraviolet radiation and a portion of visible light entering from the outside of the device.

The embodiments may provide an organic light emitting device that blocks ultraviolet radiation and a portion of visible light entering from the outside.

The embodiments may provide an organic light emitting device capable of preventing damage to a light emitting layer by blocking ultraviolet radiation and a portion of visible light entering from the outside.

The embodiments may provide a display device including an organic light emitting device capable of preventing damage to a light emitting layer by blocking ultraviolet radiation and a portion of visible light entering from the outside Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or ele-

What is claimed is:

1. An organic light emitting device, comprising:
a first electrode;
a first organic layer on the first electrode;
a first charge generating layer on the first organic layer;
a second organic layer on the first charge generating layer; and
a second electrode on the second organic layer,
wherein:
light is emitted from the device in the direction from the first electrode to the second electrode,
the first organic layer includes a first light emitting layer to emit a first light, a first hole transport region between the first electrode and the first light emitting layer, and a first electron transport region between the first light emitting layer and the first charge generating layer,
the second organic layer includes a second light emitting layer to emit a second light that is different from the first light, a second hole transport region between the first charge generating layer and the second light emitting layer, and a second electron transport region between the second light emitting layer and the second electrode, the second light emitting layer, and the second electron transport region each including a first light absorbing dye having an absorption wavelength of about 380 nm to 410 nm,
the second hole transport region includes a second hole injection layer and a second hole transport layer between the second hole injection layer and the second light emitting layer,
the second hole transport layer consists of the first light absorbing dye having an absorption wavelength of about 380 nm to 410 nm and the second hole transport layer does not include n,n'-di(1-naphthyl)-n,n'-diphenylbenzidine (NPB),
the first organic layer does not include the first light absorbing dye having an absorption wavelength of about 380 nm to 410 nm,
the first organic layer includes a phosphorescent light emitting material,
the second organic layer includes a fluorescent light emitting material, and
wherein the second organic layer has a transmittance of 10% or less with respect to light in the wavelength range of about 380 nm to 410 nm.

2. The organic light emitting device as claimed in claim 1, wherein a molecular structure of the first light absorbing dye includes at least one of a carbazole group, an amine group, or a fluorene group.

3. The organic light emitting device as claimed in claim 1, wherein the first light absorbing dye is represented by Formula 1 below:

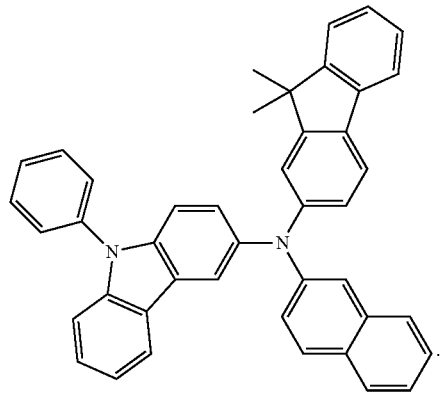

[Formula 1]

4. The organic light emitting device as claimed in claim 1, wherein the first charge generating layer includes a first sub charge generating layer and a second sub charge generating layer.

5. The organic light emitting device as claimed in claim 1, further comprising:
a third organic layer between the first electrode and the first organic layer; and
a second charge generating layer between the first organic layer and the third organic layer.

6. The organic light emitting device as claimed in claim 5, wherein:
the third organic layer includes a second fluorescent light emitting material.

7. The organic light emitting device as claimed in claim 1, further comprising:
a fourth organic layer between the second electrode and the second organic layer; and
a third charge generating layer between the second organic layer and the fourth organic layer.

8. The organic light emitting device as claimed in claim 7, wherein:
the fourth organic layer includes a second fluorescent light emitting material.

9. The organic light emitting device as claimed in claim 7, wherein the fourth organic layer includes a second light absorbing dye having an absorption wavelength of about 380 nm to 410 nm.

10. A display device, comprising:
a display panel; and
an organic light emitting device on the display panel, wherein:
the organic light emitting device includes:
a first electrode,
a first organic layer on the first electrode,
a first charge generating layer on the first organic layer,
a second organic layer on the first charge generating layer, and
a second electrode on the second organic layer, light being emitted in the direction from the first electrode to the second electrode,
the first organic layer includes a first light emitting layer to emit a first light, a first hole transport region between the first electrode and the first light emitting layer, and a first electron transport region between the first light emitting layer and the first charge generating layer,
the second organic layer includes a second light emitting layer to emit a second light that is different from the first light, a second hole transport region between the first charge generating layer and the second light emitting layer, and a second electron transport region between the second light emitting layer and the second electrode, the second light emitting layer, and the second electron transport region each including a first light absorbing dye having an absorption wavelength of about 380 nm to 410 nm, the second hole transport region includes a second hole injection layer and a second hole transport layer between the second hole injection layer and the second light emitting layer, the second hole transport layer consisting of the first light absorbing dye having an absorption wavelength of about 380 nm to 410 nm and the second hole transport layer does not include n,n'-di(1-naphthyl)-n,n'-diphenylbenzidine (NPB), the first organic layer does not include the first light absorbing dye having an absorption wavelength of about 380 nm to 410 nm, the first organic layer includes a phosphorescent light emitting material, the second organic layer includes a fluorescent light emitting material, and wherein the second organic layer has a transmittance of 10% or less with respect to light in the wavelength range of about 380 nm to 410 nm.

11. The display device as claimed in claim 10, wherein a molecular structure of the first light absorbing dye includes at least one of a carbazole group, an amine group, or a fluorene group.

12. The display device as claimed in claim 10, wherein the first light absorbing dye is represented by Formula 1 below:

[Formula 1]

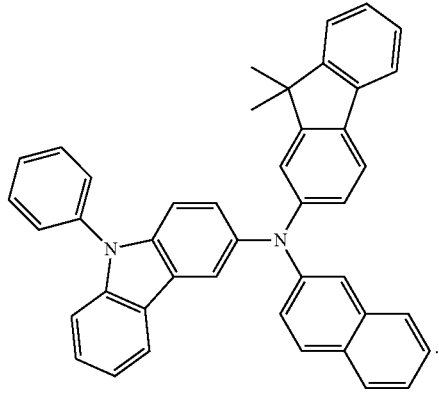

* * * * *